(12) United States Patent
Stong

(10) Patent No.: US 6,760,893 B2
(45) Date of Patent: Jul. 6, 2004

(54) USING TRANSITION TIME CHECKS TO DETERMINE NOISE PROBLEMS ON SIGNAL LINES OF AN INTEGRATED CIRCUIT

(75) Inventor: Gayvin E Stong, Fort Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 113 days.

(21) Appl. No.: 10/017,865

(22) Filed: Dec. 12, 2001

(65) Prior Publication Data

US 2003/0110459 A1 Jun. 12, 2003

(51) Int. Cl.$^7$ .............................................. G06F 17/50
(52) U.S. Cl. ...................... 716/6; 716/1; 716/4; 716/5
(58) Field of Search ........................... 716/6, 1–5, 7–14

(56) References Cited

U.S. PATENT DOCUMENTS

| | | | | | |
|---|---|---|---|---|---|
| 5,568,395 A | * | 10/1996 | Huang | ............................. | 716/4 |
| 5,983,006 A | * | 11/1999 | Carlson et al. | ................. | 716/4 |
| 6,028,989 A | * | 2/2000 | Dansky et al. | .................. | 716/8 |
| 6,128,769 A | * | 10/2000 | Carlson et al. | ................. | 716/6 |
| 6,347,393 B1 | * | 2/2002 | Alpert et al. | .................... | 716/2 |
| 6,353,917 B1 | * | 3/2002 | Muddu et al. | .................. | 716/6 |
| 6,385,565 B1 | * | 5/2002 | Anderson et al. | .............. | 703/18 |
| 6,389,581 B1 | * | 5/2002 | Muddu et al. | .................. | 716/6 |
| 6,480,998 B1 | * | 11/2002 | Mukherjee et al. | ............ | 716/13 |
| 6,487,703 B1 | * | 11/2002 | McBride et al. | ................ | 716/4 |
| 6,493,853 B1 | * | 12/2002 | Savithri et al. | ................. | 716/5 |
| 6,532,574 B1 | * | 3/2003 | Durham et al. | ................. | 716/6 |
| 6,539,527 B2 | * | 3/2003 | Naffziger et al. | .............. | 716/5 |
| 2003/0066037 A1 | * | 4/2003 | Patra et al. | ..................... | 716/2 |
| 2003/0079191 A1 | * | 4/2003 | Savithri et al. | ................. | 716/4 |

* cited by examiner

Primary Examiner—Vuthe Siek
Assistant Examiner—Magid Y. Dimyan

(57) ABSTRACT

For drivers of different sizes driving signal lines of different lengths, maximum transition time constraints are compared to signal transition times to determine whether a potential noise problem exists with respect to the signal lines. Each driver size has a maximum line length and a maximum transition time associated with it. These maximum transition time constraints are used to determine whether the signal lines connected to respective drivers in the IC will have potential noise problems associated with them. For each signal line in the IC design, the signal transition time is determined and compared to the maximum transition time constraint. If the signal transition time exceeds the maximum transition time constraint, a potential noise problem exists with respect to the signal line.

20 Claims, 3 Drawing Sheets

USING TRANSITION TIME CHECKS TO DETERMINE NOISE PROBLEMS ON SIGNAL LINES OF AN INTEGRATED CIRCUIT

TECHNICAL FIELD OF THE INVENTION

The present invention is generally related to integrated circuits (ICs) and, more particularly, to using transition times on signal lines in an IC to determine whether the signal lines have potential noise problems associated with them.

BACKGROUND OF THE INVENTION

As the geometries in integrated circuits (ICs) become ever increasingly smaller, the metallic signal lines on the ICs have become smaller in width and the spacing between the signal lines has decreased. This decrease in the width of the signal lines has increased the resistance of the signal lines. In order to reduce the resistance of the signal lines, the signal lines have been increased in height. However, this increase in height coupled with the reduction in the spacing between the signal lines increases the capacitance between adjacent signal lines. A given signal line has a signal line on each side of it, which results in the line in question coupling charge onto the lines on each side of it. Because the spacing between the lines is becoming smaller, the coupling capacitance between the lines is increasing. In addition, charge is also coupled onto the lines by elements on the IC above and below the signal lines.

This capacitance creates concerns because if, for example, the lines on both sides of the line in question are transitioning from high to low, and the line in question is at a high level, the coupling capacitance between the lines can cause the line in question to dip down to some extent below its high level. If the voltage level on the line in question dips down far enough, then the logic gate that is connected to the line in question sees a transition to a low level, which results in an erroneous state.

Various scenarios exist that make such an erroneous transition a concern. In one scenario, if the erroneous transition occurs simultaneously with, or very close in time to the end of the clock period, then the register that is capturing the next state will receive an erroneous state. Another scenario is, if the line in question is transitioning from low to high as the line on either side of it is transitioning low, the transition speed of the line in question will be reduced. If the transition speed is sufficiently reduced, then the timing requirements of the register downstream will not be met, i.e., the setup time of the downstream register will be violated. The setup time is the amount of time before the clock transitions that the data needs to be valid at the input to the register. In another scenario, if the adjacent lines are transitioning in the same direction as the line in question, then the transition speed of the line in question will be increased, which can cause hold time requirements to be violated. The hold time is the amount of time after the clock transitions that the voltage level (i.e., high or low) on the line must remain valid before it changes.

Accordingly, a need exists to be able to determine whether such transitions will result in noise on signal lines that is sufficient to cause setup and/or hold time requirements to be violated or to cause erroneous data to be latched in a register.

SUMMARY OF THE INVENTION

In accordance with the present invention, maximum transition time constraints for drivers of different sizes driving signal lines of respective maximum lengths are compared to signal transition times of an IC design to determine whether a potential noise problem exists with respect to the signal lines. Each driver size has a maximum line length constraint and a corresponding maximum transition time constraint associated with it. These maximum transition time constraints are used to determine whether the signal lines connected to respective drivers in the IC will have potential noise problems associated with them.

In accordance with the preferred embodiment of the present invention, each signal line is checked for potential noise problems. For each signal line in the IC design, the signal transition time is determined and compared to the maximum transition time constraint associated with the size of the driver driving the signal line. If the signal transition time exceeds the maximum transition time constraint, a potential noise problem exists with respect to the signal line.

These and other features and advantages of the present invention will become apparent from the following description, drawings and claims.

DETAILED DESCRIPTION OF THE INVENTION

In accordance with the present invention, simulations were performed during which signal lines on either side of a signal line in question were switched from one state to another and the noise spike on the line in question was measured. It was determined that the size of the noise spike was dependent on the lengths of the lines. In other words, the longer the lengths of the signal lines that run next to each other, the greater the total capacitive coupling, and at some length, the coupling is sufficient to produce enough noise on a given line to cause one of the aforementioned transitioning problems to occur (i.e., erroneous data is latched in a register). The simulation determined the transition times for various line lengths and their respective drivers. Based on the transition times, it can be determined whether a given line is long enough to cause coupling capacitance to produce enough noise on the line to cause problems.

Figure 1:
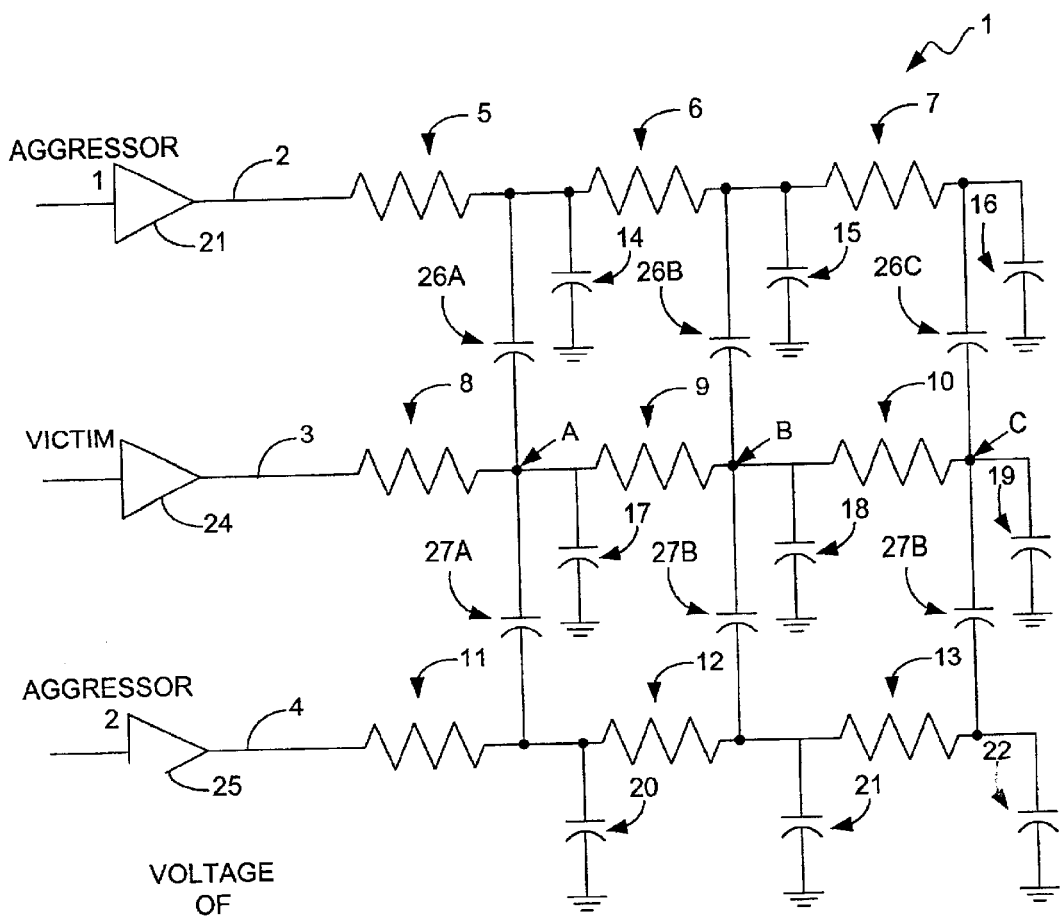
FIG. 1 is a circuit diagram illustrating capacitive coupling between adjacent signal lines on an IC.

The potential capacitive coupling problems will now be described with reference to the circuit 1 shown in FIG. 1. FIG. 1 illustrates three adjacent signal lines that are labeled "Aggressor 1", "Victim" and "Aggressor 2". The signal line in question is the Victim line 3. The maximum length of the Victim line 3 is affected by the Aggressor lines 2 and 4. Each of the lines has a resistance associated with it. The resistance associated with line 2 is represented by the resistors 5, 6 and 7. The resistance associated with line 3 is represented by the resistors 8, 9 and 10. The resistance associated with line 4 is represented by the resistors 11, 12 and 13. Each of the lines has a resistance and capacitance associated with it. Each signal line also has its own fixed capacitance. The capacitance associated with line 2 is represented by the capacitors 14, 15 and 16 connected to ground. The capacitance associated with line 3 is represented by the capacitors 17, 18 and 19 connected to ground. The capacitance associated with line 4 is represented by the capacitors 20, 21 and 22 connected to ground.

As stated above, capacitive coupling between adjacent signal lines also exists. The capacitive coupling between lines 2 and 3 is represented by capacitors 26A, 26B and 26C. The capacitive coupling between lines 3 and 4 is represented by capacitors 27A, 27B and 27C. Therefore, the total capacitance in the circuit 1 is based on the fixed capacitance of the lines, which is represented by capacitors 14–22, and the capacitive coupling between the lines, which is represented by capacitors 26A–26C and 27A–27C.

Figure 2:
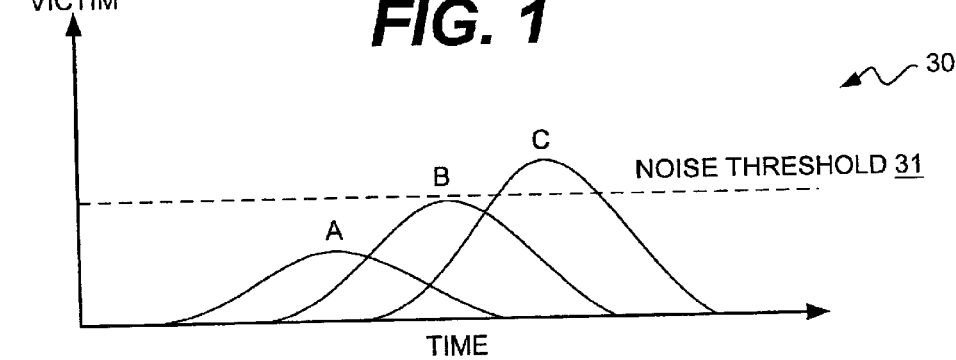
FIG. 2 is a set of voltage verses time waveforms that demonstrate when the Victim line shown in FIG. 1 exhibits a noise problem and when it does not.

Each of the signal lines 2, 3 and 4 has a driver 23, 24 and 25, respectively, associated with it that drives the line. FIG. 2 is a graph 30 illustrating the voltage of the Victim line 3 as a function of the amount of time a signal is propagating along the Victim line 3. Three nodes are labeled on the Victim line 3 at different locations along the Victim line 3. The nodes are labeled A, B and C and represent the maximum length of the line 3 for a given driver size. FIG. 2 illustrates that if a signal is driven on line 3 beyond node B, the noise threshold represented by the dashed line 31 will be exceeded. Therefore, the maximum length of the Victim line 3 for a driver of a given size "X" in this example is the length from the driver 24 to node B. If the voltage on the Victim line 3 is sufficient to drive the signal on the line beyond node B, the downstream logic coupled to Victim line 3 will detect a noise spike, which could result in the detection of an erroneous state by the downstream logic. Of course, for different driver sizes, the maximum permissible line length will be different.

It is known in the art of IC design that, for a driver of a given size, a maximum length line exists that can be driven before a noise issue arises. In accordance with the present invention, simulations were performed for drivers of all sizes driving their respective maximum length lines and it was determined what the respective transition times for all of the different driver sizes and route lengths were. This concept is demonstrated by the circuit diagram 40 of FIG. 3 and by the voltage verses time diagram 50 of FIG. 4.

Figure 3:
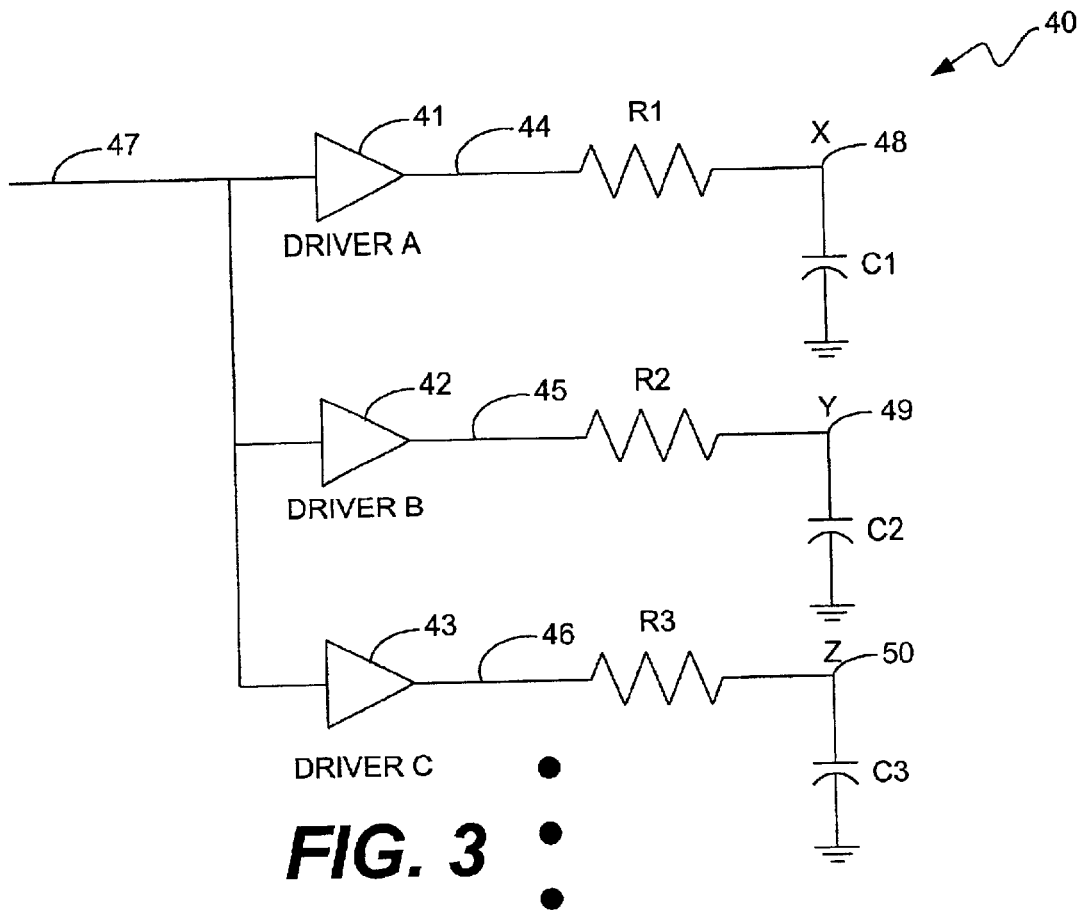
FIG. 3 is a circuit diagram illustrating three lines of different lengths driven by three respective drivers of different sizes.
Figure 4:
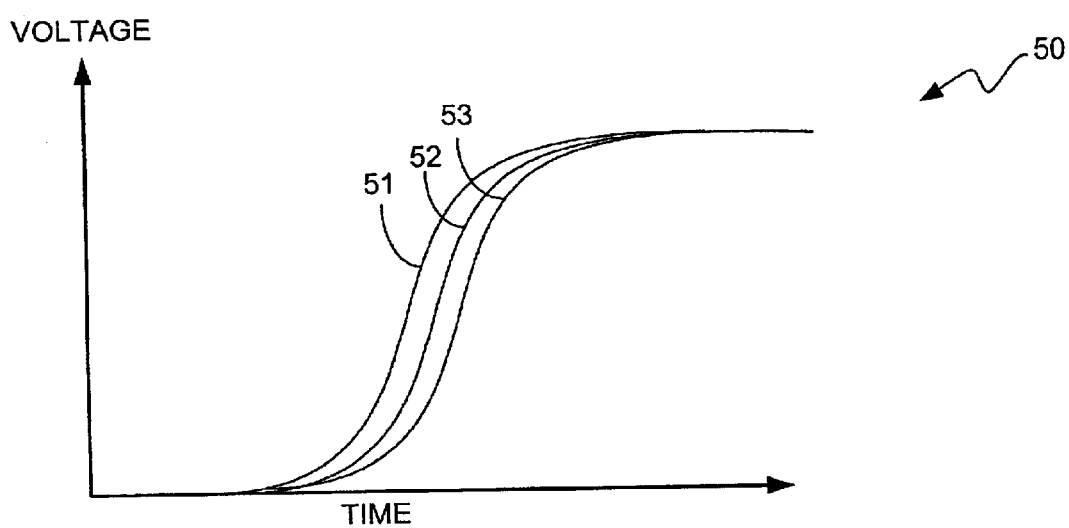
FIG. 4 is a set of waveforms corresponding to the transitions of the signals on the three lines shown in FIG. 3.

FIG. 3 illustrates three drivers 41, 42 and 43 of three different sizes, namely sizes A, B and C, respectively. Driver 41 drives a line 44 of maximum length X. Driver 42 drives a line 45 of maximum length Y. Driver 43 drives a line 46 of maximum length Z. The lines 44, 45 and 46 are shown as having respective fixed resistances and capacitances R1/C1, R2/C2 and R3/C3, respectively. The same signal 47 was used during a simulation in accordance with the present invention to simultaneously drive the drivers 41, 42 and 43 and the maximum transition times were measured at the ends 48, 49 and 50 of the lines. Although the lines 44, 45 and 46 are illustrated as being of the same length, they are not. The lengths X, Y and Z are different for the different drivers 41, 42 and 43, respectively. Also, in actuality, the simulation involved many more drivers and lines, but only three are shown for ease of illustration.

The capacitive coupling between the lines was not taken into consideration because each of the lines was being driven by the same signal 47 in the same direction at the same time. In accordance with the present invention, it was determined that these maximum transition times for each driver and its corresponding maximum length line can be used as threshold values to determine if a capacitive coupling problem or, more generally, a noise problem, exists. Therefore, the present invention enables lines that may have capacitive coupling problems associated with them to be identified without the need for performing a coupling capacitance simulation on each and every line in the design.

In essence, in accordance with the present invention, if the transition time on a signal line is determined to be less than or equal to the maximum transition time for the driver size and its corresponding maximum line length, no noise issues (i.e., capacitive coupling problems) need to be addressed. If the transition time exceeds the maximum transition time for the driver, then a noise problem resulting from capacitive coupling is determined to exist and steps will need to be taken to eliminate the problem. The manner in which the problem is eliminated is outside of the scope of the present invention. Such problems may be rectified by, for example, shortening the line length or interrupting the line with a repeater.

Figure 5:
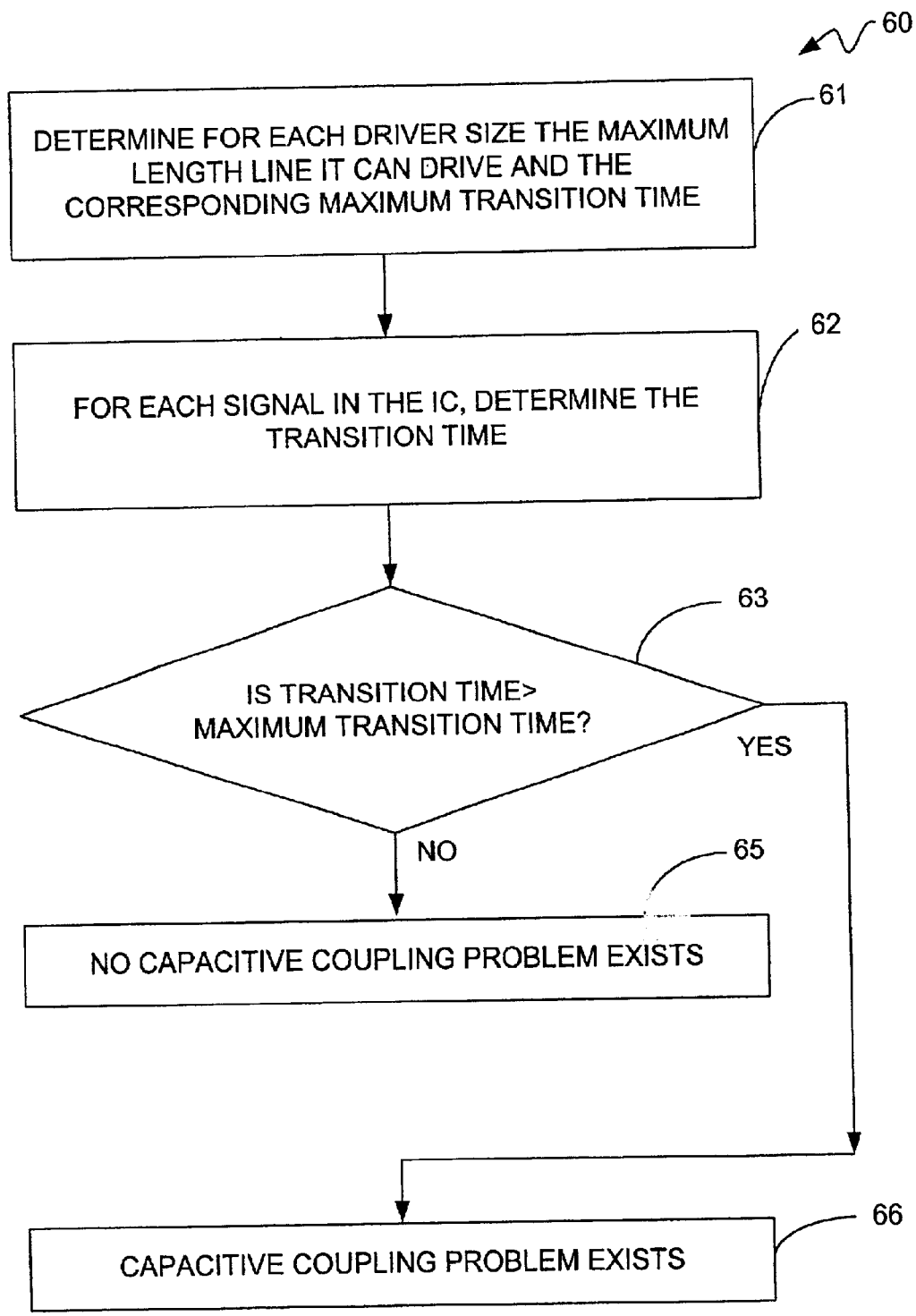
FIG. 5 is a flow chart of the method of the present invention in accordance with the preferred embodiment for identifying signal lines having noise problems associated with them.

The method 60 of the present invention in accordance with the preferred embodiment is shown in FIG. 5. As stated above, a simulation was performed for each driver size and its associated maximum line length to determine the maximum transition time for each driver. This simulation is represented by block 61. Preferably, this simulation is only performed once for a given IC fabrication process. The results preferably are stored in a table that associates each driver size with a maximum transition time.

With this information, each line of a design can be tested to determine whether the line has a noise problem associated with it. As indicated in block 63, a determination is made as to whether or not the maximum transition time has been exceeded for the given driver. If so, a determination is made that a capacitive coupling problem exists, as indicated by the arrow from block 63 to block 66. If a determination is made at block 63 that the maximum transition time has not been exceeded, then a determination is made that there is no noise problem associated with the signal line, as indicated by the arrow from block 63 to block 65.

Another advantage of the present invention is that it allows the number of noise problems in synthesized blocks to be reduced. By looking at the range of maximum transition times, a transition time can be chosen that corresponds to the minimum transition time found in that range and used as a maximum transition time constraint in synthesis. This is especially useful when using Physical Synthesis where the tool will then place cells close enough together to prevent exceeding this maximum transition time constraint, or the tool will insert a buffer in the corresponding route. Thus, noise problems can be prevented a priori.

It should be noted that the present invention has been described with reference to the particular embodiments and that modifications to the embodiments described herein can be made without deviating from the scope of the present invention. It should also be noted that the present invention is not limited to any particular IC process. For example, the present invention applies to field effect transistor (FET) technology as well as bipolar junction transistor technology (BJT) or any other IC process technology currently in use or developed in the future.

What is claimed is:

1. An apparatus for determining whether noise problems potentially will occur on signal lines within an integrated circuit (IC), the signal lines being conductive metal lines in the IC, the apparatus comprising:

first logic, the first logic comparing a signal transition time with a maximum signal transition time constraint for a particular conductive metal line of the IC; and second logic, the second logic determining whether said signal transition time exceeds said maximum signal transition time, wherein if a determination is made by the second logic that said signal transition time does not exceed said maximum signal transition time, a decision is made that no noise problem exists with respect to said particular conductive metal line, wherein said decision is based solely on the determination that the transition time does not exceed the maximum signal transition time.

2. The apparatus of claim 1, wherein a processing technology used to design the IC is a complementary metal oxide semiconductor (CMOS) field effect transistor (FET) technology.

3. An apparatus for determining whether noise problems potentially will occur on signal lines within an integrated circuit (IC), the signal lines being conductive metal lines in the IC, the apparatus comprising:

first logic, the first logic determining the maximum length line that can be driven by each driver of the IC and the respective maximum transition time associated with the respective drivers and the respective maximum length lines associated with the respective drivers;

second logic, the second logic determining a transition time for each signal on the IC being driven by respective drivers over respective conductive metal lines of the IC; and third logic, the third logic determining whether said transition time for each signal exceeds the maximum transition time associated with the driver driving the respective signal over the respective conductive metal line in the IC, wherein if a determination is made that a transition time of a signal does not exceed the maximum transition time associated with a driver driving the signal, then a decision is made that no noise problem exists with respect to the conductive metal line over which the signal having the transition time that does not exceed the maximum transition time is driven, wherein said decision is based solely on the determination that the transition time does not exceed the maximum signal transition time.

4. The apparatus of claim 3, wherein the first, second and third logic correspond to a computer executing a software program that makes the determination of whether a noise problem will potentially occur on a signal line.

5. The apparatus of claim 4, wherein the determinations made by the first and second logic are saved in a memory element accessible by the computer and associated with each other so that stored determinations can be utilized repeatedly by the computer to make the determinations associated with the third logic repeatedly for different IC designs.

6. The apparatus of claim 3, wherein the apparatus is a design tool used during the design of the IC prior to manufacturing the IC.

7. The apparatus of claim 3, wherein the first, second and third logic correspond to separate software routines being executed by a computer, the software routine associated with the first logic being a separate program from the software routines associated with the second and third logic.

8. The apparatus of claim 3, wherein the determinations performed by the first, second and third logic are independent of an IC processing technology used to design the IC.

9. The apparatus of claim 3, wherein a processing technology used to design the IC is a metal oxide semiconductor field effect transistor (MOSFET) technology.

10. An apparatus for determining whether noise problems potentially will occur on signal lines within an integrated circuit (IC), the signal lines being conductive metal lines in the IC, the apparatus comprising:

a memory element, for drivers of different sizes, the memory element having maximum transition time constraints stored therein;

a processor in communication with the memory element, wherein for a design of the IC, the processor determines a transition time for each expected signal of the IC design that is to be driven by respective drivers over respective conductive metal lines of the IC, and then determines whether or not the transition time for each signal exceeds the maximum transition time constraint associated with the driver driving the respective signal over the respective conductive metal line in the IC design, wherein if a determination is made by the processor that a transition time of a signal does not exceed the maximum transition time associated with the driver driving the signal, a decision is made by the processor that a noise problem does not extst with respect to the conductive metal line over which the signal having the transition time that does not exceed the maximum transition time is driven, wherein said decision is based solely on the determination that the transition time does not exceed the maximum signal transition time.

11. A method for determining whether noise problems potentially will occur on signal lines within an integrated circuit (IC), the signal lines being conductive metal lines in the IC, the method comprising the steps of:

determining the maximum length line that can be driven by each driver of the IC and the respective maximum transition time associated with the respective drivers and the respective maximum length lines associated with the respective drivers;

determining a transition time for each signal on the IC being driven by respective drivers over respective conductive metal lines of the IC; and determining whether or not said transition time for each signal exceeds the maximum transition time associated with the driver driving the respective signal over the respective conductive metal line in the IC, wherein if a determination is made that a transition time of a signal does not exceed the maximum transition time associated with the driver driving the signal, then a decision is made that a noise problem does not exist with respect to the conductive metal line over which the signal having the transition time that does not exceed the maximum transition time is driven, wherein said decision is based solely on said determination that the transition time does not exceed the maximum signal transition time.

12. The method of claim 11, wherein the method is performed by a computer executing a software program that makes the determination of whether a noise problem will potentially occur on a signal line.

13. The method of claim 11, wherein the method is performed by a design tool used during the design of the IC prior to manufacturing the IC.

14. The method of claim 11, wherein each of the determining steps corresponds to a separate software routine being executed by a computer.

15. The method of claim 11, wherein a processing technology used to design the IC is a metal oxide semiconductor field effect transistor (MOSFET) technology and wherein said method is used during the design of the IC.

16. The method of claim 11, wherein a processing technology used to design the IC is a complementary metal oxide semiconductor (CMOS) field effect transistor (FET) technology and wherein said method is used during the design of the IC.

17. A method for determining whether noise problems potentially will occur on signal lines within an integrated circuit (IC), the signal lines being conductive metal lines in the IC, the method comprising the steps of:

for drivers of different sizes, storing in a memory element associated maximum transition time constraints;

for a design of the IC, utilizing a processor to compare a transition time for each expected signal of the IC design that is to be driven by respective drivers over respective conductive metal lines of the IC with an associated maximum time constraint read by the processor from the memory element, wherein if the result of the comparison is that a transition time of an expected signal does not exceed the associated maximum time constraint read out of the memory element, the processor determines that no noise problem exists with respect to the conductive metal line over which the signal having the transition time that does not exceed the maximum transition time is driven, wherein the determination that no noise problem exists is based solely on the determination that the transition time does not exceed the maximum signal transition time.

18. A method for determining whether noise problems potentially will occur on signal lines within an integrated circuit (IC), the signal lines being conductive metal lines in the IC, the method comprising the steps of:

comparing a signal transition time with a maximum signal transition time for a particular conductive metal line of the IC; and determining whether or not said signal transition time exceeds said maximum signal transition time, wherein it a determination is made that said signal transition time does not exceed said maximum signal transition time, a decision is made that no noise problem exists with respect to said particular conductive metal line, wherein said decision is based solely on the determination that the transition time does not exceed the maximum signal transition time.

19. A computer program for determining whether noise problems potentially will occur on signal lines within an integrated circuit (IC), the signal lines being conductive metal lines in the IC, the computer program being embodied on a computer readable medium, the computer program comprising:

a first code segment, the first code segment comparing a signal transition time with a maximum signal transition time for a particular conductive metal line of the IC; and a second code segment, the second code segment determining whether or not said signal transition time exceeds said maximum signal transition time, wherein if a determination is made that said signal transition time does not exceed said maximum signal transition time, a decision is made that no noise problem exists with respect to said particular conductive metal line, wherein said decision is based solely on the determination that the transition time does not exceed the maximum signal transition time.

20. A computer program for determining whether noise problems potentially will occur on signal lines within an integrated circuit (IC), the signal lines being conductive metal lines in the IC, the computer program being embodied on a computer readable medium, the computer program comprising:

a first code segment, the first code segment determining the maximum length line that can be driven by each driver of the IC and the respective maximum transition time associated with the respective drivers and the respective maximum length lines;

a second code segment, the second code segment determining a transition time for each signal on the IC being driven by respective drivers over respective conductive metal lines of the IC; and a third code segment, the third code segment determining whether or not said transition time for each signal exceeds the maximum transition time associated with the driver driving the respective signal over the respective conductive metal line in the IC, wherein if a determination is made that a transition time of a signal does not exceed the maximum transition time associated with the driver driving the signal, then a decision is made that no noise problem exists with respect to the conductive metal line over which the signal having the transition time that does not exceed the maximum transition time is driven, wherein said decision is based solely on the determination that the transition time does not exceed the maximum signal transition time.

* * * * *